United States Patent
Lee et al.

(10) Patent No.: US 8,399,327 B2
(45) Date of Patent: Mar. 19, 2013

(54) METHODS OF MANUFACTURING A SEMICONDUCTOR DEVICE

(75) Inventors: Jong-Won Lee, Hwaseong-si (KR); Jae-Seok Kim, Seoul (KR); Bo-Un Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/240,560

(22) Filed: Sep. 22, 2011

(65) Prior Publication Data
US 2012/0122283 A1 May 17, 2012

(30) Foreign Application Priority Data
Nov. 15, 2010 (KR) .................. 10-2010-0113286

(51) Int. Cl.
*H01L 21/336* (2006.01)
(52) U.S. Cl. ............... 438/287; 438/926; 257/E21.585
(58) Field of Classification Search .................. 438/634, 438/926, 970, 976
See application file for complete search history.

(56) References Cited

U.S. PATENT DOCUMENTS

| 7,126,199 | B2* | 10/2006 | Doczy et al. ........... 257/412 |
| 7,335,589 | B2 | 2/2008 | Lee |
| 7,622,340 | B2* | 11/2009 | Akasaka et al. ........ 438/199 |
| 7,915,111 | B2* | 3/2011 | Yang et al. ............. 438/199 |
| 2006/0017116 | A1 | 1/2006 | Kim |

FOREIGN PATENT DOCUMENTS
KR 10-1997-0052384 A 7/1997

* cited by examiner

*Primary Examiner* — Chandra Chaudhari
(74) *Attorney, Agent, or Firm* — Lee & Morse, P.C.

(57) ABSTRACT

A method includes forming a plurality of dummy gate structures on a substrate, each dummy gate structure including a dummy gate electrode and a dummy gate mask, forming a first insulation layer on the substrate and the dummy gate structures to fill a first space between the dummy gate structures, planarizing upper portions of the first insulation layer and the dummy gate structures, removing the remaining first insulation layer to expose a portion of the substrate, forming an etch stop layer on the remaining dummy gate structures and the exposed portion of the substrate, forming a second insulation layer on the etch stop layer to fill a second space between the dummy gate structures, planarizing upper portions of the second insulation layer and the etch stop layer to expose the dummy gate electrodes, removing the exposed dummy gate electrodes to form trenches, and forming metal gate electrodes in the trenches.

16 Claims, 10 Drawing Sheets

METHODS OF MANUFACTURING A SEMICONDUCTOR DEVICE

CROSS-REFERENCE TO RELATED APPLICATIONS

Korean Patent Application No. 10-2010-0113286, filed on Nov. 15, 2010, in the Korean Intellectual Property Office, and entitled: "Methods of Manufacturing a Semiconductor Device," is incorporated by reference herein in its entirety.

BACKGROUND

1. Field

Example embodiments relate to methods of manufacturing semiconductor devices. More particularly, example embodiments relate to methods of manufacturing semiconductor devices having metal gate electrodes.

2. Description of the Related Art

When manufacturing a semiconductor device having a metal gate electrode, after forming dummy gate structures and an etch stop layer pattern, an insulation layer may be formed on the etch stop layer pattern to fill a space between the dummy gate structures. After partially removing the insulation layer and the etch stop layer to expose the dummy gate structures, the exposed dummy gate structures may be replaced with the metal gate electrode.

SUMMARY

According to an embodiment, there is provided a method of manufacturing a semiconductor device, the method including forming a plurality of dummy gate structures on a substrate, each dummy gate structure including a dummy gate electrode and a dummy gate mask, forming a first insulation layer on the substrate and the dummy gate structures to fill a first space between the dummy gate structures, planarizing upper portions of the first insulation layer and the dummy gate structures, removing the remaining first insulation layer to expose a portion of the substrate, forming an etch stop layer on the remaining dummy gate structures and the exposed portion of the substrate, forming a second insulation layer on the etch stop layer to fill a second space between the dummy gate structures, planarizing upper portions of the second insulation layer and the etch stop layer to expose the dummy gate electrodes, removing the exposed dummy gate electrodes to form trenches, and forming metal gate electrodes in the trenches.

The method may further include forming a capping layer on sidewalls of the dummy gate structures and the substrate prior to the forming of the first insulation layer.

The capping layer may be formed to have a thickness of about 1 Å to about 10 Å.

The capping layer may be formed using a material having an etching selectivity with respect to the first insulation layer.

The first insulation layer may be formed of silicon oxide. The capping layer may be formed of silicon nitride.

The method may further include forming gate spacers on sidewalls of the dummy gate structures prior to the forming of the first insulation layer.

The planarizing of the upper portions of the first insulation layer and the dummy gate structures may be performed by a chemical mechanical polishing (CMP) process.

The planarizing of the upper portions of the first insulation layer and the dummy gate structures may include removing the dummy gate masks to expose upper faces of the dummy gate electrodes.

The planarizing of the upper portions of the first insulation layer and the dummy gate structures may include partially removing the dummy gate masks.

The etch stop layer may be formed to have a thickness of about 50 Å to about 1000 Å.

The second insulation layer may be formed to have no void therein.

Each of the dummy gate structures may further include a low-k dielectric layer pattern between the substrate and the dummy gate electrode.

The method may further include forming a high-k dielectric layer pattern on the low-k dielectric layer pattern prior to the forming of the metal gate electrodes.

The method may further include forming impurity regions at upper portions of the substrate adjacent to the dummy gate structures prior to forming the first insulation layer.

According to an embodiment, there is provided a method of manufacturing a semiconductor device, the method including forming first and second dummy gate structures on a substrate in first and second regions, respectively, the first dummy gate structure having a first dummy gate electrode and a first dummy gate mask sequentially stacked, and the second dummy gate structure having a second dummy gate electrode and a second dummy gate mask sequentially stacked, forming a first insulation layer on the substrate and the dummy gate structures to fill a first space between the dummy gate structures, planarizing upper portions of the first insulation layer and the dummy gate structures, removing the remaining first insulation layer to expose a portion of the substrate, forming an etch stop layer on the remaining dummy gate structures and the exposed portion of the substrate, forming a second insulation layer on the etch stop layer to fill a second space between the dummy gate structures, planarizing upper portions of the second insulation layer and the etch stop layer to expose the dummy gate electrodes, removing the exposed first and second dummy gate electrodes to form first and second trenches, respectively, and forming first and second metal gate electrodes to fill the first and second trenches, respectively.

According to an embodiment, there is provided a method of manufacturing a semiconductor device, the method including forming a plurality of dummy gate structures on a substrate, each dummy gate structure including a dummy gate electrode and a dummy gate mask sequentially stacked, the plurality of dummy gate structures being formed such that a first space is provided between adjacent ones of the plurality of dummy gate structures, and the plurality of dummy gate structures having a first aspect ratio, forming a first insulation layer to fill the first space between the dummy gate structures, removing all or part of the dummy gate masks to provide dummy gate electrode structures having a second aspect ratio smaller than the first aspect ratio, removing the first insulation layer to create a second space between the dummy gate electrode structures, forming an etch stop layer to partially fill the second space between the dummy gate electrode structures, forming a second insulation layer on the etch stop layer to fill a remaining portion of the second space between the dummy gate structures, removing the exposed dummy gate electrodes to form trenches, and forming metal gate electrodes in the trenches.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
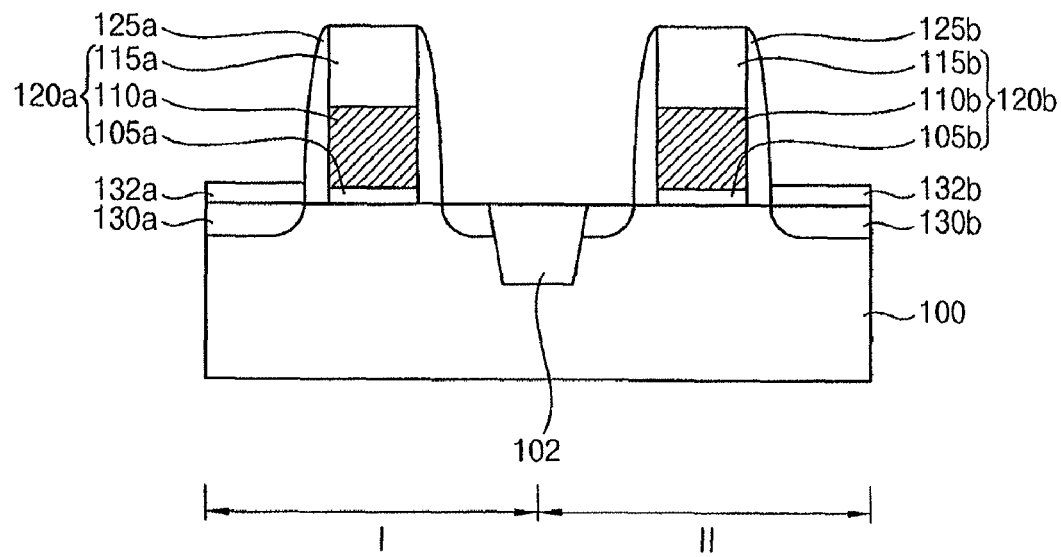
FIGS. 1 to 15 illustrate cross-sectional views depicting a method of manufacturing a semiconductor device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

It will be understood that, although the terms first, second, etc. may be used herein to describe various structures or features, these structures or features should not be limited by these terms. These terms are only used to distinguish one structure or feature from another structure or feature. Thus, a first structure or feature discussed below could be termed a second structure or feature without departing from the teachings of the inventive concept.

Spatially relative terms, such as "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "upper" portions with respect to other elements or features would then be oriented below the other elements or features. Thus, the exemplary term "upper" may be understood regardless of orientation of the device in the figures. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific teens) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 15 are cross-sectional views illustrating a method of manufacturing a semiconductor device in accordance with example embodiments.

Referring to FIG. 1, a first dummy gate structure 120a, a second dummy gate structure 120b, a first gate spacer 125a, a second gate spacer 125b, a first source/drain region and a second source/drain region may be formed on a substrate 100 having an isolation layer 102 thereon.

The substrate 100 may include a semiconductor substrate such as a silicon substrate, a germanium substrate or a silicon-germanium substrate, a silicon-on-insulator (SOI) substrate, a germanium-on-insulator (GOI) substrate, etc. The substrate 100 may include a well region (not illustrated) having p-type impurities or n-type impurities. The substrate 100 may be divided into a first region I and a second region II. In example embodiments, the first region I and the second region II may be a negative-channel metal oxide semiconductor (NMOS) region and a positive-channel metal oxide semiconductor (PMOS) region, respectively.

The isolation layer 102 may be formed by removing an upper portion of the substrate 100 to form a first trench (not shown) and filling an insulating material into the first trench.

The first and second dummy gate structures 120a and 120b may be formed by sequentially forming a low-k dielectric layer, a dummy gate conductive layer and a dummy gate mask layer on the substrate 100 and patterning the dummy gate mask layer, the dummy gate conductive layer and the low-k dielectric layer. Thus, the first dummy gate structure 120a may be formed to include a first low-k dielectric layer pattern 105a, a first dummy gate electrode 110a and a first dummy gate mask 115a sequentially stacked on the substrate 100 in the first region I. The second dummy gate structure 120b may be formed to include a second low-k dielectric layer pattern 105b, a second dummy gate electrode 110b and a second dummy gate mask 115b sequentially stacked on the substrate 100 in the second region II.

The low-k dielectric layer may be formed using a low-k dielectric material, for example, an oxide such as silicon oxide or an oxynitride such as silicon oxynitride. The low-k dielectric layer may be formed using the low-k dielectric material by a chemical vapor deposition (CVD) process or a thermal oxide process. The dummy gate conductive layer may be formed using polysilicon. The dummy gate mask layer may be formed using silicon nitride or silicon oxynitride. The dummy gate conductive layer and the dummy gate mask layer may be formed by a CVD process, a physical vapor deposition (PVD) process, an atomic layer deposition (ALD) process, etc.

The first and second gate spacers 125a and 125b may be formed on sidewalls of the first and second dummy gate structures 120a and 120b, respectively. Particularly, after forming a gate spacer layer covering the first and second dummy gate structures 120a and 120b on the substrate 100, the gate spacer layer may be partially removed by an anisotropic etching process to form the first and second gate spacers 125a and 125b. The gate spacer layer may be formed using silicon nitride or silicon oxynitride.

In example embodiments, the first source/drain region may be formed to include a first impurity region 130a and a first elevated source/drain (ESD) layer 132a. The second source/drain region may be formed to include a second impurity region 130b and a second ESD layer 132b.

Particularly, a first mask (not illustrated) covering the second region II may be formed, and an upper portion of the substrate 100 in the first region I may be removed using the first mask, the first dummy gate structure 120a and the first gate spacer 125a as an etching mask to form a second trench (not illustrated). A first selective epitaxial growth (SEG) process may be performed using an exposed portion of the substrate 100 by the second trench as a seed layer to form the first impurity region 130a. In example embodiments, the first SEG process may be performed by a CVD process at a temperature of about 500° C. to about 900° C. under a pressure of about 0.1 torr to atmospheric pressure. For example, the CVD process may be performed using disilane ($Si_2H_6$) gas, $SiH_3CH_3$ gas, etc. as a source gas. A single crystalline silicon layer or a single crystalline silicon carbide (SiC) layer may be formed as the first impurity region 130a. In the above process, an n-type impurity source gas, e.g., phosphine ($PH_3$) gas may be further used to form a single crystalline silicon layer doped with impurities or a silicon carbide layer doped with impurities.

A second SEG process may be performed on the first impurity region 130a to form the first ESD layer 132a. The second SEG process may be performed using the first impurity region 130a as a seed layer. In example embodiments, the second SEG process may be formed by a CVD process at a temperature of about 500° C. to about 900° C. under a pressure of about 0.1 torr to atmospheric pressure. The CVD process may be performed using an n-type impurity source gas such as dichlorosilane ($SiH_2Cl_2$) gas, phosphine ($PH_3$) gas, etc. to form a single crystalline silicon layer doped with n-type impurities as the first ESD layer 132a.

In example embodiments, the first SEG process for forming the first impurity region 130a and the second SEG process for forming the first ESD layer 132a may be performed in-situ.

After forming a second mask covering the first region I, an upper portion of the substrate 100 in the second region II may be removed using the second mask, a second dummy gate structure 120b and the second gate spacer 125b as an etching mask to form a third trench (not illustrated). A third SEG process may be performed using an exposed portion of the substrate 100 by the third trench as a seed layer to form the second impurity region 130b. A fourth SEG process may be performed using the second impurity region 130b as a seed layer to form the second ESD layer 132b.

The third SEG process may be performed using dichlorosilane ($SiH_2Cl_2$) gas, germane ($GeH_4$) gas, etc. as a source gas. Thus, a single crystalline silicon germanium (SiGe) layer may be formed as the second impurity region 130b. In the above process, a p-type impurity source gas, e.g., diborane ($B_2H_6$) gas may be further used to form a single crystalline silicon germanium layer doped with impurities. The fourth SEG process may be performed using a p-type impurity source gas such as dichlorosilane ($SiH_2Cl_2$) gas, diborane ($B_2H_6$) gas, etc. to form a single crystalline silicon layer doped with p-type impurities as the second ESD layer 132b. The third and fourth SEG processes may be performed in-situ.

Processes for forming the first and second ESD layers 132a and 132b may be omitted, and in this case, the first and second impurity regions 130a and 130b may be used by themselves as the first and second source/drain regions, respectively.

Figure 2:
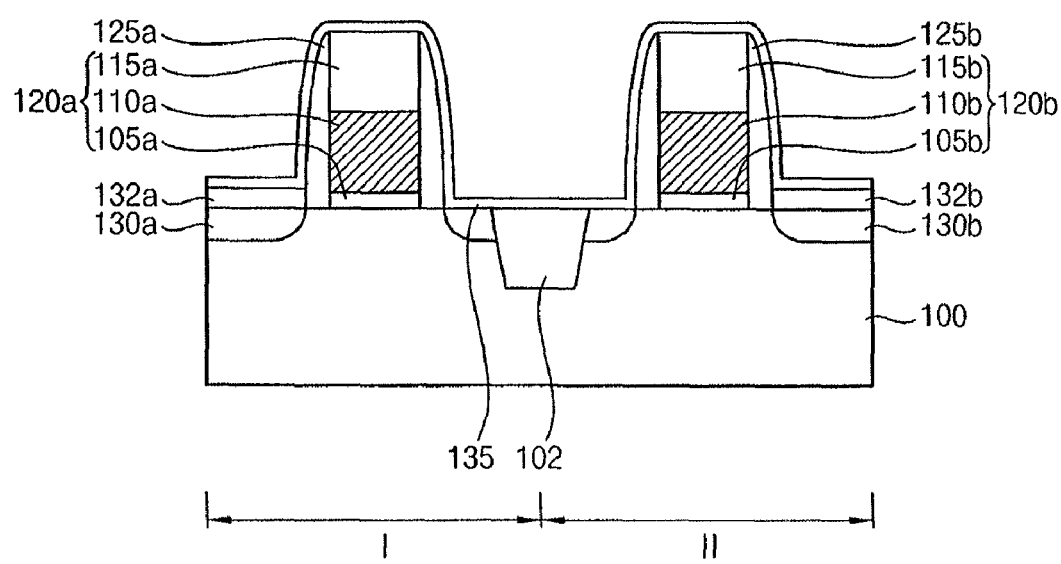

Referring to FIG. 2, a capping layer 135 may be formed on the substrate 100 and the isolation layer 102 to cover the first and second dummy gate structures 120a and 120b and the first and second gate spacers 125a and 125b.

The capping layer 135 may be formed using a material that is not easily etched by an etchant for etching an oxide included in a first insulation layer 140 subsequently formed (refer to FIG. 3). The capping layer 135 may be formed to have a thickness less than a thickness of an etch stop layer 145 subsequently formed (refer to FIG. 7). In example embodiments, the capping layer 135 may have a thickness of about 1 Å to about 10 Å.

Figure 3:
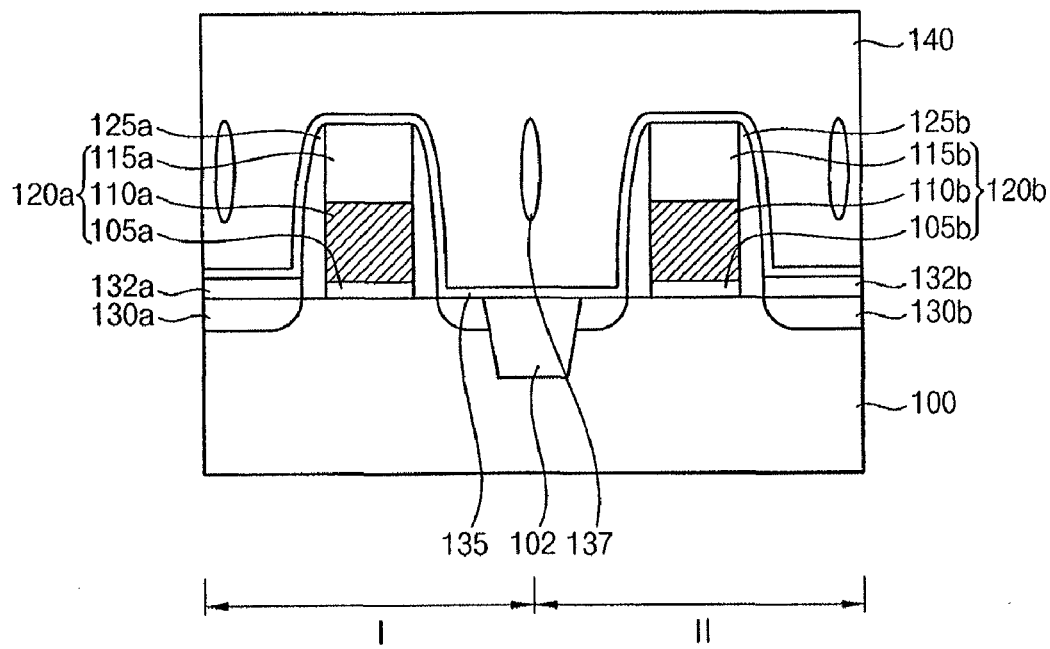

Referring to FIG. 3, the first insulation layer 140 may be formed to cover the capping layer 135 and fill a space between the first and second dummy gate structures 120a and 120b. When aspect ratios of the first and second dummy gate structures 120a and 120b are substantially large, a void 137 may be formed between the first and second dummy gate structures 120a and 120b.

The first insulation layer 140 may be formed using an oxide, e.g., boron phosphorus silicate glass (BPSG).

Figure 4:
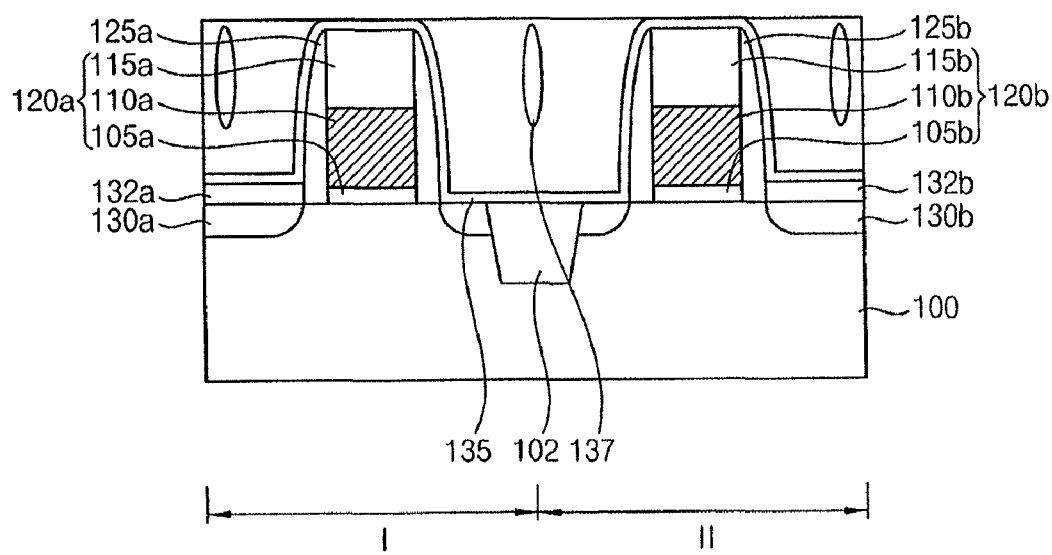

Referring to FIG. 4, an upper portion of the first insulation layer 140 may be removed by a chemical mechanical polishing (CMP) process to expose a portion of the capping layer 135.

When the first and second dummy gate masks 115a and 115b are substantially thin, a first slurry having a polishing selectivity of equal to or more than about 2 between oxide included in the first insulation layer 140 and polysilicon included in the first and second dummy gate electrodes 110a and 110b may be used in the CMP process. Damage to the first and second dummy gate electrodes 110a and 110b in the CMP process may be thereby avoided. On the other hand, when thicknesses of the first and second dummy gate masks 115a and 115b are sufficiently large, a second slurry having a polishing selectivity of equal to or more than about 2 between oxide included in the first insulation layer 140 and silicon nitride included in the first and second dummy gate masks 115a and 115b may be used. The first and second dummy gate electrodes 110a and 110b may not be substantially affected by the CMP process.

Figure 5:
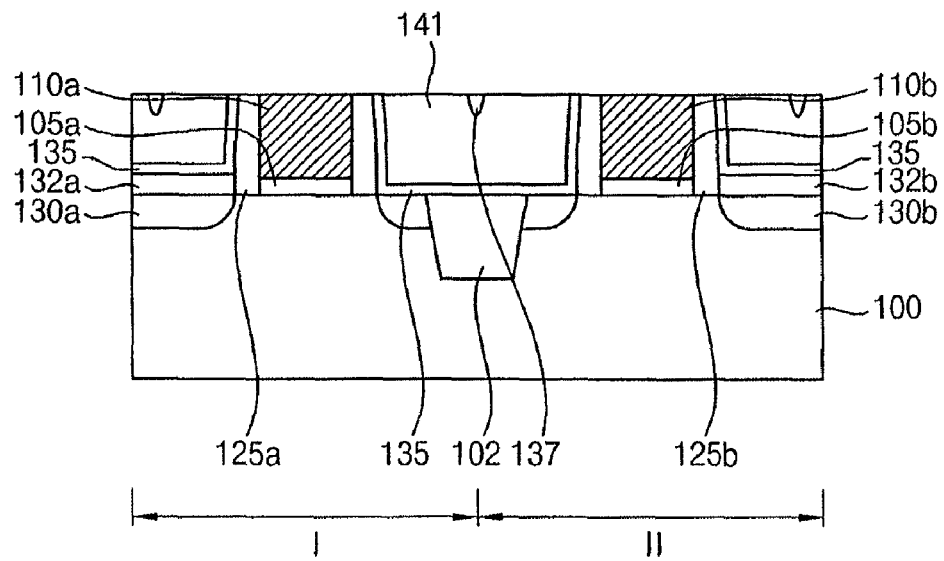

Referring to FIG. 5, upper portions of the first insulation layer 140, the capping layer 135 and the dummy gate spacers 125a and 125b, and the gate masks 115a and 115b may be removed to expose upper faces of the first and second dummy gate electrodes 110a and 110b. A first insulation layer pattern 141 may be formed between the first and second dummy gate electrodes 110a and 110b. A portion of the void 137 may remain between the first and second dummy gate electrodes 110a and 110b. In example embodiments, the upper faces of the first and second dummy gate electrodes 110a and 110b may be exposed by a CMP process and/or a dry etch process.

Figure 6:
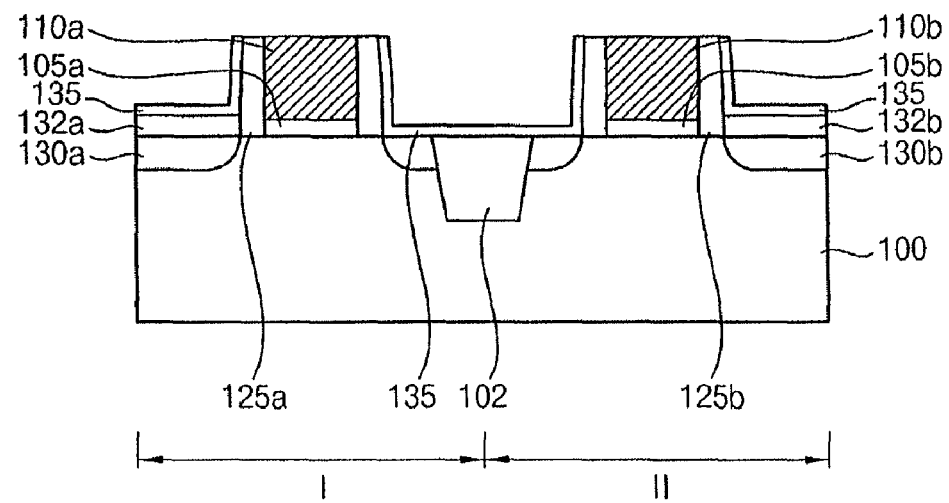

Referring to FIG. 6, the first insulation layer pattern 141 may be removed.

In example embodiments, the first insulation layer pattern 141 may be removed by a dry etch process and/or a wet etch process. During the removal of the first insulation layer pattern 141, the isolation layer 102, the first and second ESD layers 132a and 132b, the first and second gate spacers 125a and 125b may be protected by the capping layer 135.

The remaining portion of the void 137 between the first and second dummy gate electrodes 110a and 110b may be also removed by the removal of the first insulation layer pattern 141.

Figure 7:
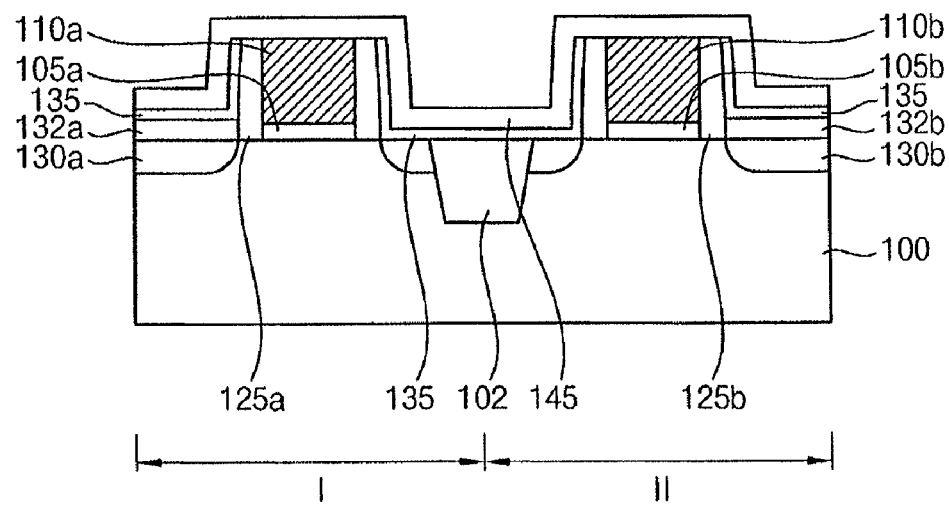

Referring to FIG. 7, the etch stop layer 145 may be formed on the first and second dummy gate electrodes 110a and 110b, the capping layer 135 and the first and second gate spacers 125a and 125b.

In example embodiments, the etch stop layer 145 may be formed to have a thickness of about 50 Å to about 1000 Å.

Figure 8:
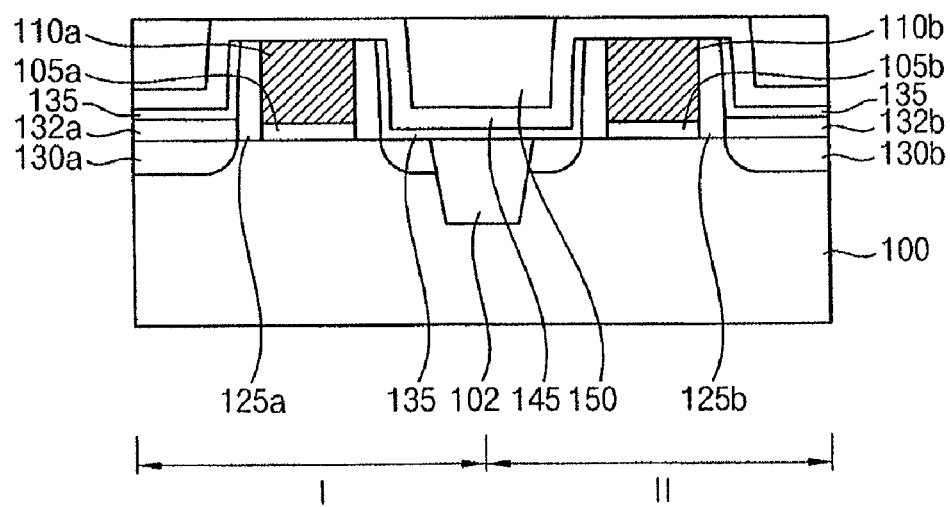

Referring to FIG. 8, a second insulation layer 150 may be formed on the etch stop layer 145 to fill a space between the first and second dummy gate electrodes 110a and 110b sufficiently.

The second insulation layer 150 may be formed using an oxide such as BPSG. Even though the original dummy gate structures 120a and 120b have substantially large aspect ratios, the dummy gate masks 115a and 115b have been already removed at this stage, and only the dummy gate electrodes 110a and 110b and the low-k dielectric layer patterns 105a and 105b remain on the substrate 100. Accordingly, a creation of a void in the second insulation layer 150 does not occur.

A CMP process may be further performed to planarize an upper face of the second insulation layer 150, thereby exposing an upper face of the etch stop layer 145.

Figure 9:
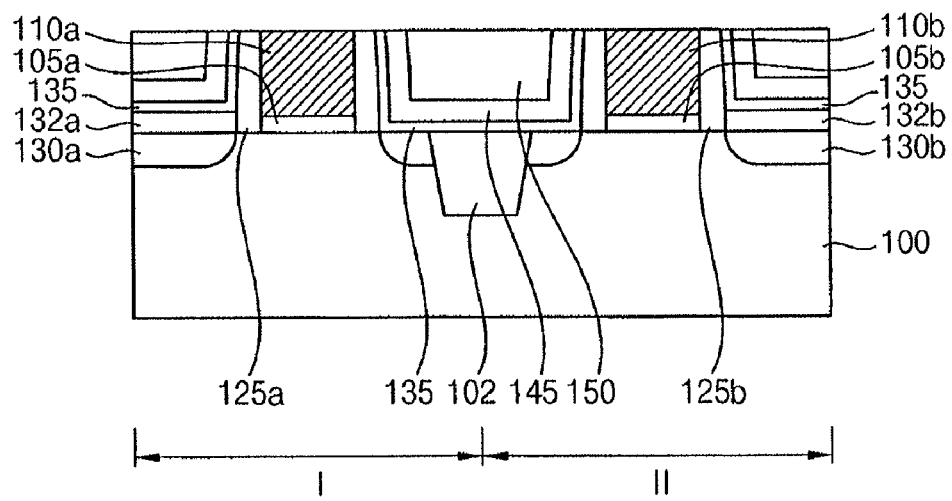

Referring to FIG. 9, upper portions of the etch stop layer 145 and the second insulation layer 150 may be removed to expose upper faces of the dummy gate electrodes 110a and 110b. In example embodiments, the upper portions of the etch stop layer 145 and the second insulation layer 150 may be removed by a CMP process and/or a dry etch process.

Figure 10:
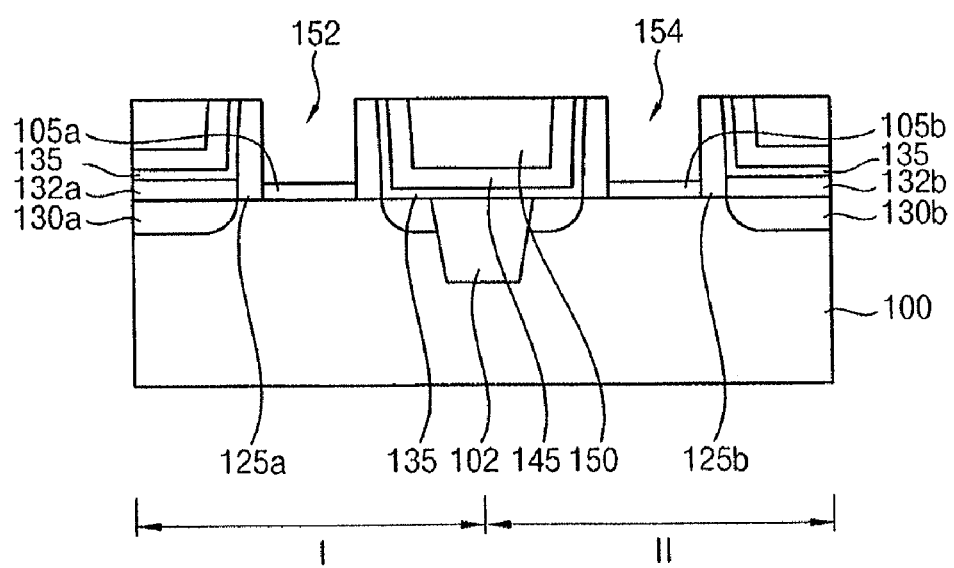

Referring to FIG. 10, the exposed first and second dummy gate electrodes 110a and 110b may be removed to form first and second trenches 152 and 154, respectively.

In example embodiments, the first and second dummy gate electrodes 110a and 110b may be removed by a dry etch process and/or a wet etch process.

Figure 11:
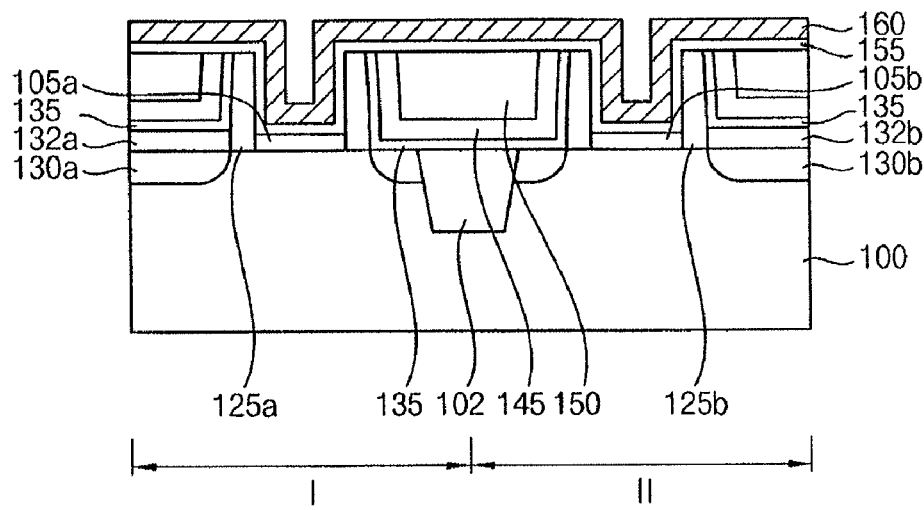

Referring to FIG. 11, a high-k dielectric layer 155 and a p-type metal layer 160 may be formed sequentially on inner walls of the first and second trenches 152 and 154, and on the first and second gate spacers 125a and 125b, the capping layer 135, the etch stop layer 145 and the second insulation layer 150.

The high-k dielectric layer 155 may be formed by an ALD process using a high-k dielectric material. For example, the high-k dielectric layer 155 may be formed using hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, iridium oxide, aluminum oxide, lead scandium tantalum oxide, lead zinc niobate, etc. In example embodiments, the high-k dielectric layer 155 may be formed to have a thickness equal to or less than about 40 Å, preferably, a thickness of about 5 Å to about 20 Å.

The term "p-type metal layer" may refer to a metal layer having a work function of about 4.9 eV to about 5.2 eV. In example embodiments, the p-type metal layer 160 may be formed using a metal such as ruthenium, palladium, platinum, cobalt, nickel, or a metal oxide such as ruthenium oxide. In example embodiments, the p-type metal layer 160 may be formed to have a thickness of about 25 Å to about 300 Å, preferably a thickness of about 50 Å to about 100 Å.

Figure 12:
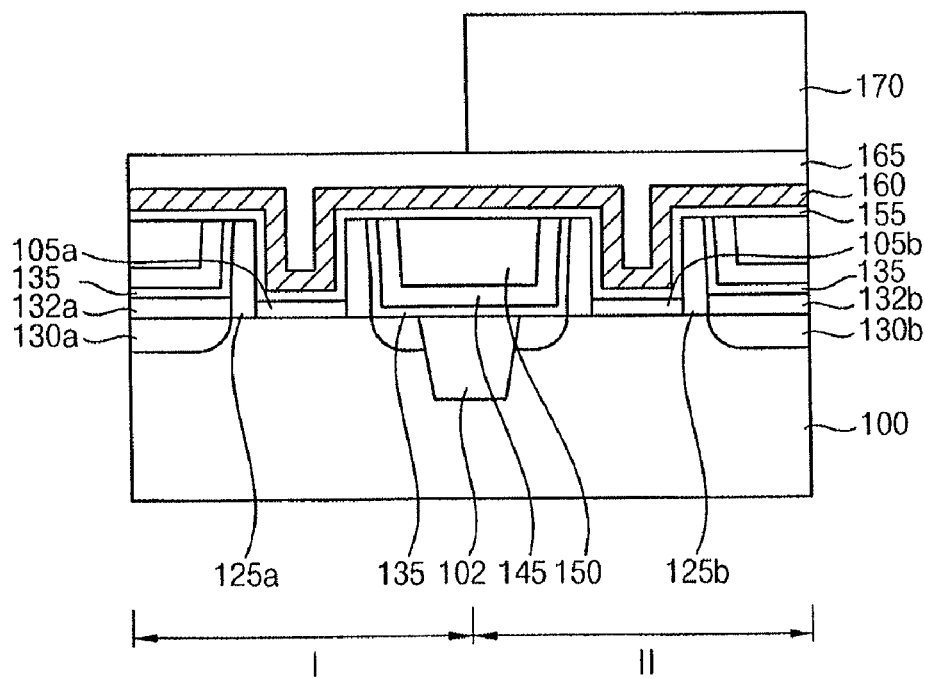

Referring to FIG. 12, a planarization layer 165 may be formed on the p-type metal layer 160 to fill remaining portions of the first and second trenches 152 and 154.

In example embodiments, the planarization layer 165 may be formed using spin-on-glass (SOG).

A photoresist pattern 170 may be formed on the planarization layer 165 to cover the second region II.

Figure 13:
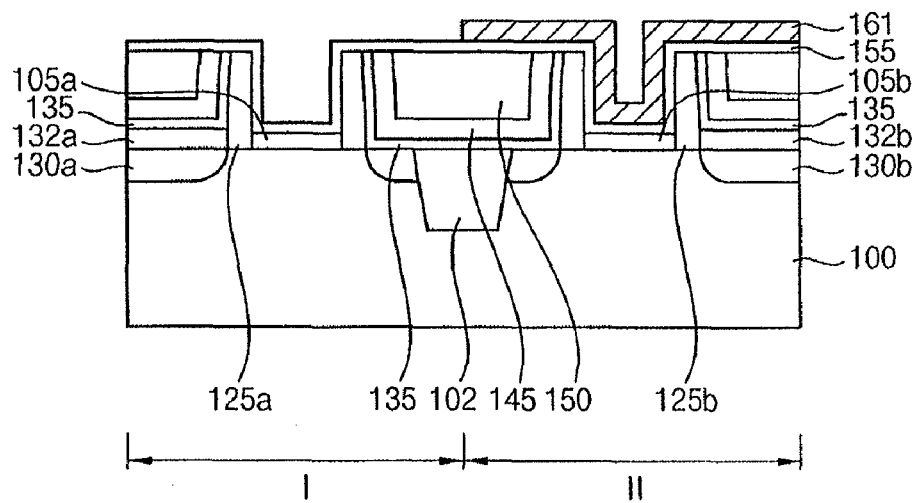

Referring to FIG. 13, a portion of the planarization layer 165 may be removed using the photoresist pattern 170 as an etching mask. Thus, a portion of the p-type metal layer 160 in the first region I may be exposed.

The exposed portion of the p-type metal layer 160 may be removed to form a p-type metal layer pattern 161. Thus, a portion of the high-k dielectric layer 155 in the first region I may be exposed.

The photoresist pattern 170 and the planarization layer 165 may be removed.

Figure 14:
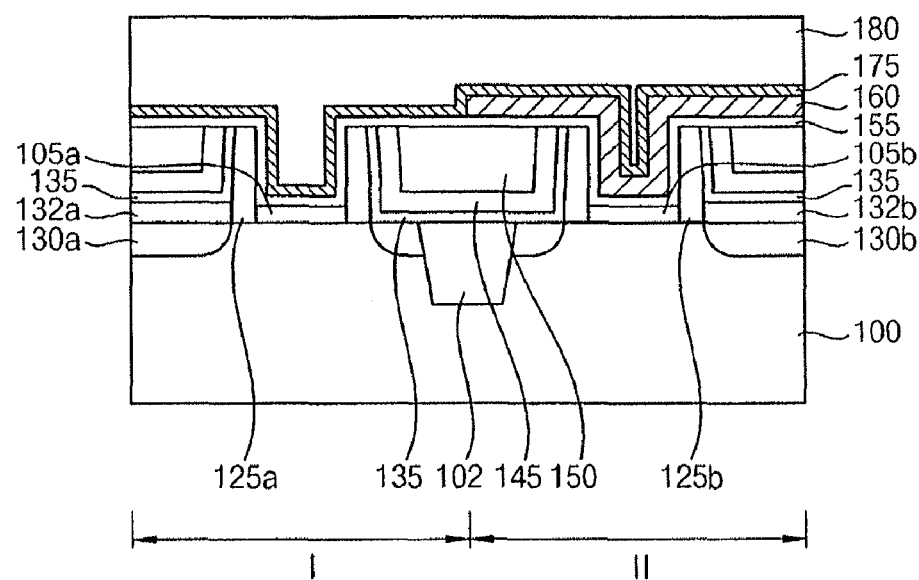

Referring to FIG. 14, an n-type metal layer 175 may be formed on the p-type metal layer pattern 161 and the exposed portion of the high-k dielectric layer 155.

The term "n-type metal layer" may refer to a metal layer having a work function of about 3.9 eV to about 4.2 eV. In example embodiments, the n-type metal layer 175 may be formed using a metal such as hafnium, zirconium, titanium, tantalum, aluminum, etc., or a metal carbide, a metal nitride or a metal aluminide having the above elements. In example embodiments, the n-type metal layer 175 may be formed to have a thickness of about 25 Å to about 300 Å, preferably, a thickness of about 50 Å to about 100 Å.

A filling layer 180 may be formed on the n-type metal layer 175 to fill remaining portions of the first and second trenches 152 and 154.

In example embodiments, the filling layer 180 may be formed using a metal that may be polished easily. For example, the filling layer 180 may be formed using titanium nitride, tungsten, titanium, aluminum, tantalum, tantalum nitride, cobalt, copper, nickel, etc.

Figure 15:
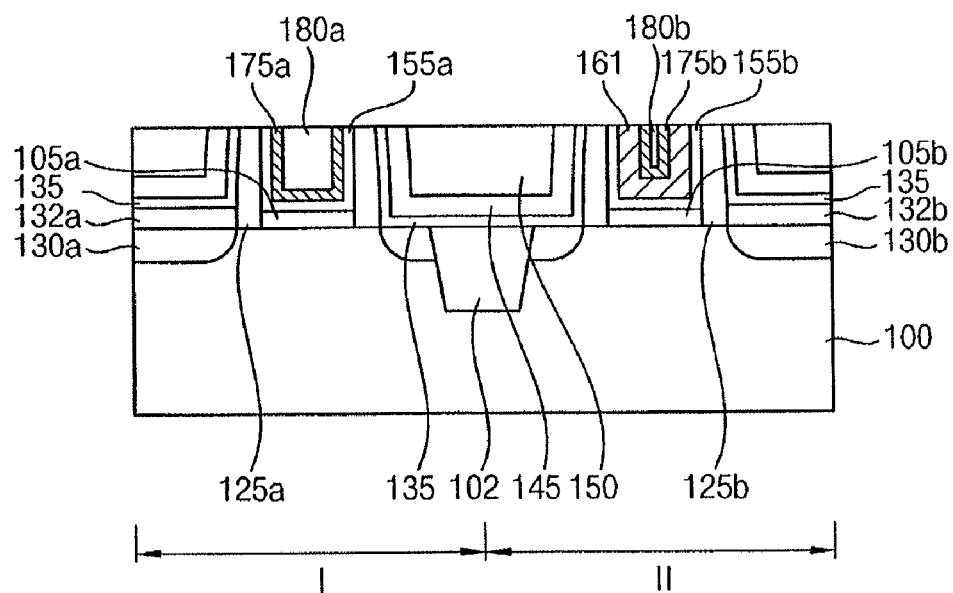

Referring to FIG. 15, upper portions of the filling layer 180, the n-type metal layer 175, the p-type metal layer pattern 161 and the high-k dielectric layer 155 may be removed by a planarization process.

In example embodiments, the planarization process may be performed by a CMP process and/or a dry etch process. In example embodiments, after removing the upper portion of the filling layer 180 by the CMP process, the upper portions of the n-type metal layer 175, the p-type metal layer pattern 161 and the high-k dielectric layer 155 may be removed by the dry etch process.

As illustrated above, the semiconductor device including first and second metal gate structures on the substrate 100 in the first and second regions I and II, respectively, may be manufactured.

The first metal gate structure may have the first low-k dielectric layer pattern 105a, a first high-k dielectric layer pattern 155a, a first n-type metal layer pattern 175a and a first filling layer pattern 180a sequentially stacked on the substrate 100, and the second metal gate structure may have the second low-k dielectric layer pattern 105b, a second high-k dielectric layer pattern 155b, a second n-type metal layer pattern 175b and a second filling layer pattern 180b sequentially stacked on the substrate 100.

The second insulation layer 150 may be formed between the first and second metal gate structures. The second insulation layer 150 may be free from voids or metal residue in or on the second insulation layer 150. Thus, the semiconductor device may have no leakage currents.

FIGS. 16 to 20 are cross-sectional views illustrating a method of manufacturing a semiconductor device in accordance with other example embodiments. This method may be substantially the same as that illustrated with reference to FIGS. 1 to 15, except that the dummy gate masks may not completely removed in the process for exposing the dummy gate electrodes. Therefore, like reference numbers refer to like elements, and repetitive explanations will not be repeated.

First, processes substantially the same as or similar to the processes illustrated with reference to FIGS. 1 to 4 may be performed.

Figure 16:
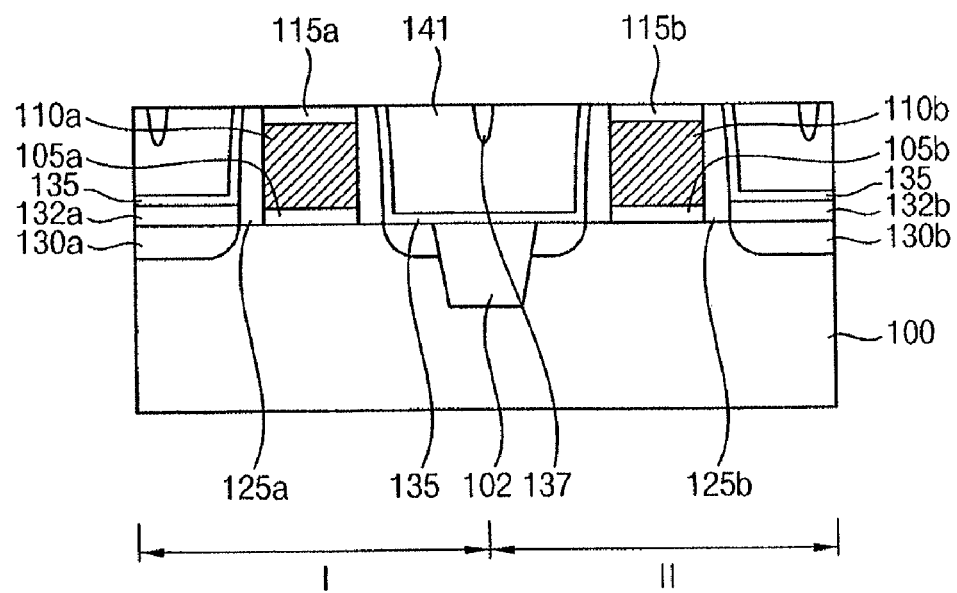
FIGS. 16 to 20 illustrate cross-sectional views depicting a method of manufacturing a semiconductor device in accordance with other example embodiments.

Then, referring to FIG. 16, upper portions of the first insulation layer 140, the capping layer 135, the dummy gate masks 115a and 115b and the dummy gate spacers 125a and 125b may be removed. Thus, a first insulation layer pattern 141 may be formed between the first and second dummy gate structures 120a and 120b, and a portion of a void 137 may remain between first and second dummy gate structures 120a and 120b. In the above removal process, thicknesses of the dummy gate masks 115a and 115b may be sufficiently large, so that the dummy gate masks 115a and 115b may not completely removed and the dummy gate electrodes 110a and 110b may not be exposed.

Figure 17:
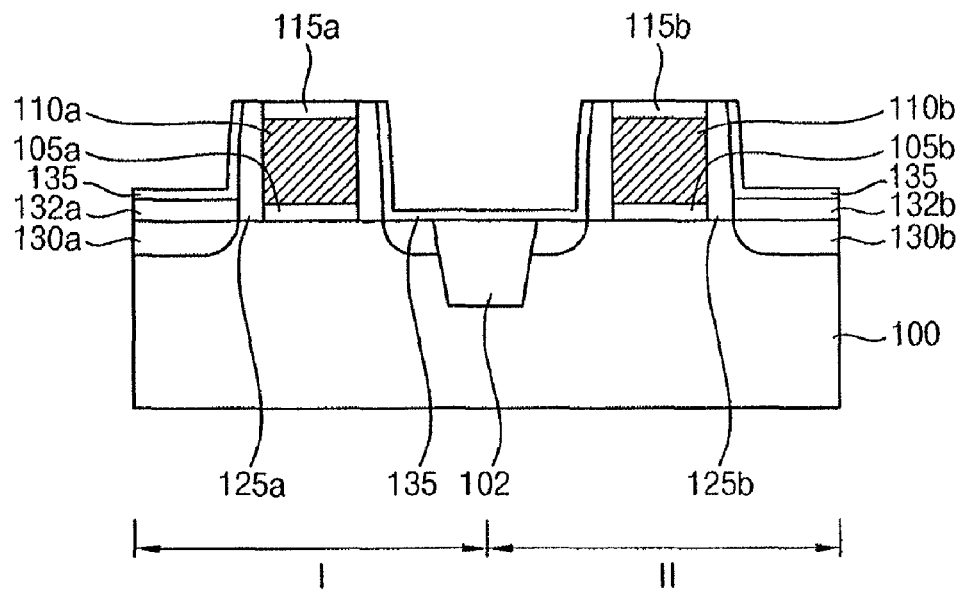

Referring to FIG. 17, the first insulation layer pattern 141 may be removed.

In example embodiments, the first insulation layer pattern 141 may be removed by a dry etch process and/or a wet etch process. During the removal of the first insulation layer pattern 141, the isolation layer 102, the first and second ESD layers 132a and 132b, and the first and second gate spacers 125a and 125b may be protected by the capping layer 135. The remaining portion of the void 137 between the first and second dummy gate structures 120a and 120b may be removed according as the first insulation layer pattern 141 is removed.

Figure 18:
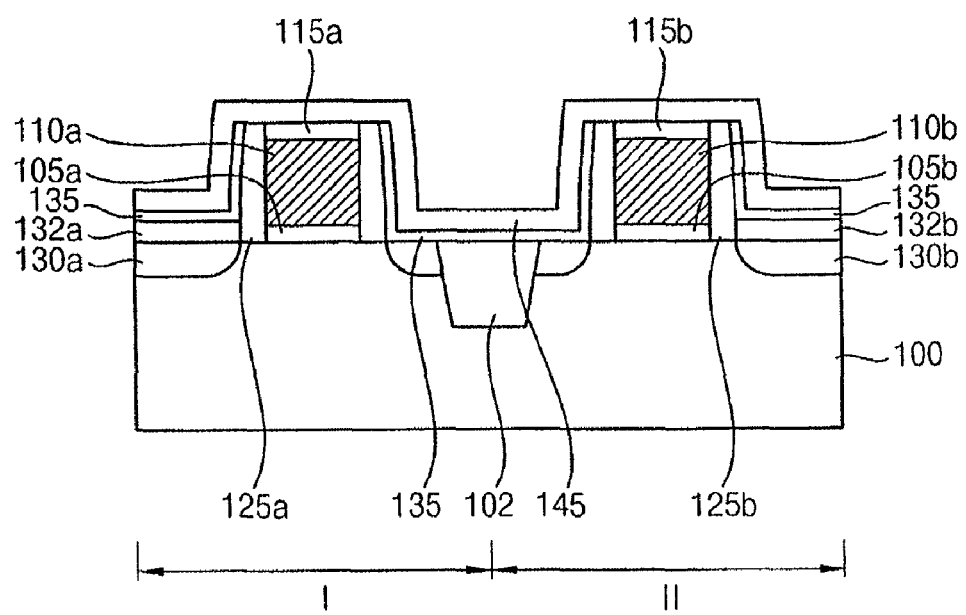

Referring to FIG. 18, an etch stop layer 145 may be formed on the remaining first and second dummy gate masks 115a and 115b, the capping layer 135, and the first and second gate spacers 125a and 125b.

Figure 19:
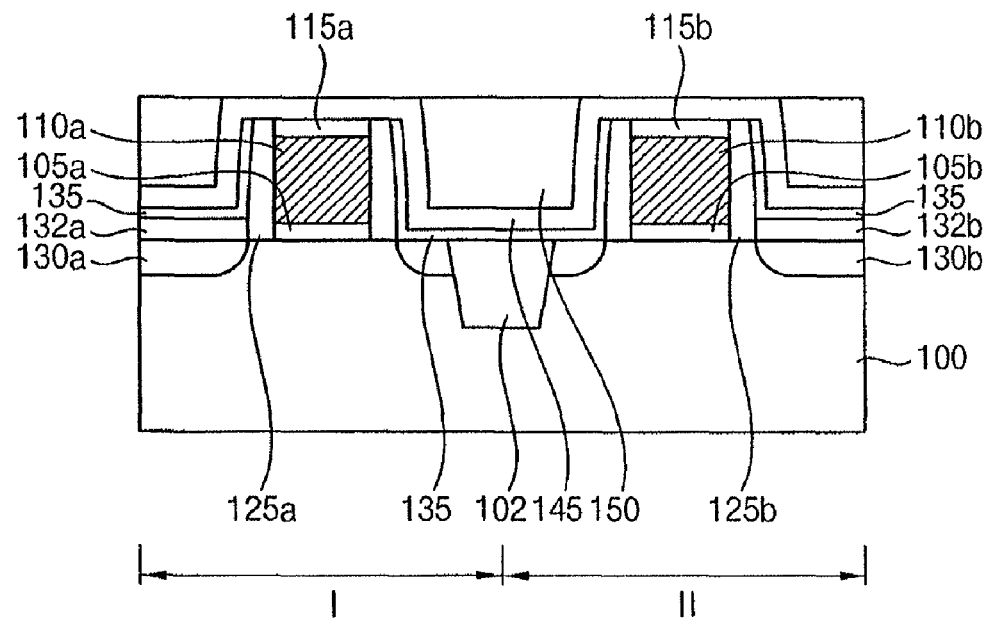

Referring to FIG. 19, a second insulation layer 150 may be formed on the etch stop layer 145 to fill a space between the first and second dummy gate structures 120a and 120b sufficiently.

Even though the first and second dummy gate structures 120a and 120b have substantially large aspect ratios to begin with, by the time the second insulation layer 150 is formed, some portions of the first and second dummy gate masks 115a and 115b have been already removed. Thus, the second insulation layer 145 may be formed with no void therein.

A CMP process may be performed to planarize an upper face of the second insulation layer 150. An upper face of the etch stop layer 145 may be exposed.

Figure 20:
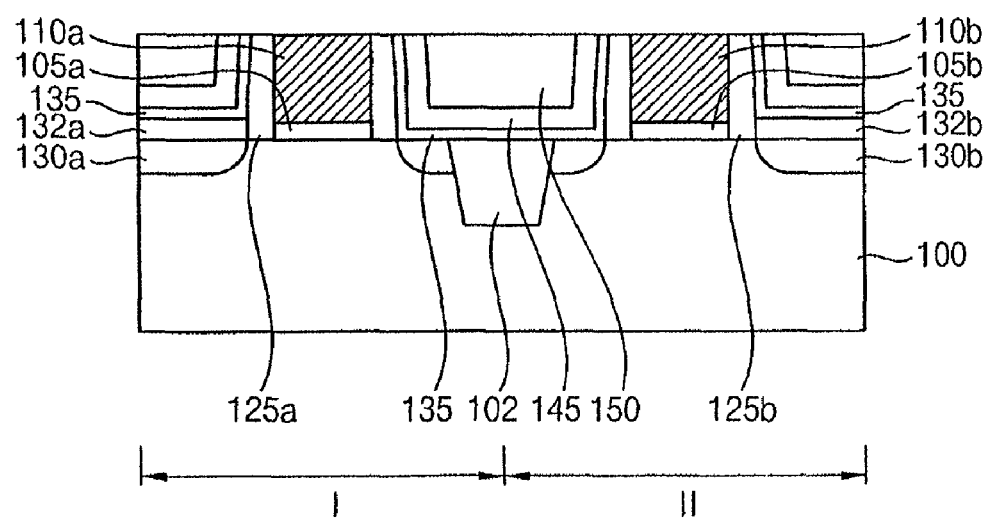

Referring to FIG. 20, upper portions of the etch stop layer 145, the second insulation layer 150, the first and second dummy gate masks 115a and 115b, the first and second gate spacers 125a and 125b, and the capping layer 135 may be removed to expose an upper face of the first and second dummy gate electrodes 110a and 110b.

Then, processes substantially the same as or similar to the processes illustrated with reference to FIGS. 10 to 15 may be performed to manufacture the semiconductor device.

By way of summation and review, as semiconductor memory devices have become more highly integrated, the dummy gate structures may have a high aspect ratio, and a void may be formed in the insulation layer between the dummy gate structures. A metal used for forming the metal gate electrode may remain in the void, and the remaining metal may cause the leakage current problems between the gate electrodes, thereby degenerating the electrical characteristics of the semiconductor device.

Example embodiments disclosed herein may advance the art by providing that an etch stop layer pattern and an insulation layer may be formed after removing upper portions of dummy gate structures on a substrate, so that no void may be generated in the insulation layer between the dummy gate structures even though the dummy gate structures have substantially high aspect ratios. Thus, a semiconductor device having low leakage current may be manufactured. That is, the example embodiments provide a method of manufacturing a semiconductor device including a metal gate electrode and having good electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    forming a plurality of dummy gate structures on a substrate, each dummy gate structure including a dummy gate electrode and a dummy gate mask;
    forming a first insulation layer on the substrate and the dummy gate structures to fill a first space between the dummy gate structures;
    planarizing upper portions of the first insulation layer and the dummy gate structures;
    removing a remaining first insulation layer to form an exposed portion of the substrate;
    forming an etch stop layer on remaining dummy gate structures and the exposed portion of the substrate;
    forming a second insulation layer on the etch stop layer to fill a second space between the dummy gate structures;
    planarizing upper portions of the second insulation layer and the etch stop layer to form exposed dummy gate electrodes;
    removing the exposed dummy gate electrodes to form trenches; and
    forming metal gate electrodes in the trenches.

2. The method as claimed in claim 1, further comprising:
    forming a capping layer on sidewalls of the dummy gate structures and the substrate prior to the forming of the first insulation layer.

3. The method as claimed in claim 2, wherein the capping layer is formed to have a thickness of about 1 Å to about 10 Å.

4. The method as claimed in claim 1, wherein the capping layer is formed using a material having an etching selectivity with respect to the first insulation layer.

5. The method as claimed in claim 1, wherein:
    the first insulation layer is formed of silicon oxide, and
    the capping layer is formed of silicon nitride.

6. The method as claimed in claim 1, further comprising:
    forming gate spacers on sidewalls of the dummy gate structures prior to the forming of the first insulation layer.

7. The method as claimed in claim 1, wherein the planarizing of the upper portions of the first insulation layer and the dummy gate structures is performed by a chemical mechanical polishing (CMP) process.

8. The method as claimed in claim 1, wherein the planarizing of the upper portions of the first insulation layer and the dummy gate structures includes:
removing the dummy gate masks to expose upper faces of the dummy gate electrodes.

9. The method as claimed in claim 1, wherein the planarizing of the upper portions of the first insulation layer and the dummy gate structures includes:
partially removing the dummy gate masks.

10. The method as claimed in claim 1, wherein the etch stop layer is formed to have a thickness of about 50 Å to about 1000 Å.

11. The method as claimed in claim 1, wherein the second insulation layer is formed to have no void therein.

12. The method as claimed in claim 1, wherein each of the dummy gate structures further includes a low-k dielectric layer pattern between the substrate and the dummy gate electrode.

13. The method as claimed in claim 12, further comprising:
forming a high-k dielectric layer pattern on the low-k dielectric layer pattern prior to the forming of the metal gate electrodes.

14. The method as claimed in claim 1, further comprising:
forming impurity regions at upper portions of the substrate adjacent to the dummy gate structures prior to forming the first insulation layer.

15. A method of manufacturing a semiconductor device, the method comprising:
forming first and second dummy gate structures on a substrate in first and second regions, respectively, the first dummy gate structure having a first dummy gate electrode and a first dummy gate mask sequentially stacked, and the second dummy gate structure having a second dummy gate electrode and a second dummy gate mask sequentially stacked;
forming a first insulation layer on the substrate and the dummy gate structures to fill a first space between the dummy gate structures;
planarizing upper portions of the first insulation layer and the dummy gate structures;
removing a remaining first insulation layer to form an exposed portion of the substrate;
forming an etch stop layer on remaining dummy gate structures and the exposed portion of the substrate;
forming a second insulation layer on the etch stop layer to fill a second space between the dummy gate structures;
planarizing upper portions of the second insulation layer and the etch stop layer to form exposed first and second the dummy gate electrodes;
removing the exposed first and second dummy gate electrodes to form first and second trenches, respectively; and
forming first and second metal gate electrodes to fill the first and second trenches, respectively.

16. A method of manufacturing a semiconductor device, the method comprising:
forming a plurality of dummy gate structures on a substrate, each dummy gate structure including a dummy gate electrode and a dummy gate mask sequentially stacked, the plurality of dummy gate structures being formed such that a first space is provided between adjacent ones of the plurality of dummy gate structures, and the plurality of dummy structures having a first aspect ratio;
forming a first insulation layer to fill the first space between the dummy gate structures;
removing all or part of the dummy gate masks to provide dummy gate electrode structures having a second aspect ratio smaller than the first aspect ratio;
removing the first insulation layer to create a second space between the dummy gate electrode structures;
forming an etch stop layer to partially fill the second space between the dummy gate electrode structures;
forming a second insulation layer on the etch stop layer to fill a remaining portion of the second space between the dummy gate structures;
removing the dummy gate electrode structures to form trenches; and
forming metal gate electrodes in the trenches.

* * * * *